ANALOG-TO-DIGITAL CONVERTER

Filed Nov. 1, 1960 3 Sheets-Sheet 1

INVENTOR
R. A. KAENEL
BY Lucian C. Canepa

ATTORNEY

March 31, 1964 R. A. KAENEL 3,127,601

ANALOG-TO-DIGITAL CONVERTER

Filed Nov. 1, 1960 3 Sheets-Sheet 2

INVENTOR
R. A. KAENEL
BY Lucian C. Canepa

ATTORNEY

ANALOG-TO-DIGITAL CONVERTER

Filed Nov. 1, 1960 3 Sheets-Sheet 3

INVENTOR
R. A. KAENEL
BY Lucian C. Canepa
ATTORNEY

United States Patent Office 3,127,601

Patented Mar. 31, 1964

3,127,601
ANALOG-TO-DIGITAL CONVERTER

Reginald A. Kaenel, Murray Hill, N.J., assignor to Bell Telephone Laboratories, Incorporated, New York, N.Y., a corporation of New York Filed Nov. 1, 1960, Ser. No. 66,512
7 Claims. (Cl. 340—347)

This invention relates to signal translating systems, and more particularly to analog-to-digital converters.

One known type of analog-to-digital converter is disclosed in R. A. Heising Reissue Patent 23,686, July 14, 1953. In essence, the Heising converter comprises a reversible binary counter the count of which is selectively increased or decreased by a fixed repetition rate bipolar pulse source under the control of an error amplifier whose output is a function of a first voltage representative of the condition of the counter and a second voltage proportional to the analog message wave to be converted.

In the Heising arrangement, the accurate conversion or encoding of an analog message wave having a bandwith of about 100 kilocycles requires an error amplifier having a bandwidth of about 200 megacycles. Obviously, the design of such a broadband amplifier presents numerous difficult problems of stabilization and compensation.

An object of the present invention is the improvement of signal translating systems.

More specifically, an object of this invention is the provision of Heising-type analog-to-digital converters which do not require broadband amplifiers.

A further object of the present invention is the provision of analog-to-digital converters which are characterized by high reliability and extreme simplicity of design.

These and other objects of the present invention are realized in a specific illustrative analog-to-digital converter embodiment thereof that comprises a reversible binary counter whose count is selectively increased or decreased by the output of a variable repetition rate bipolar pulse source. In turn, the repetiton rate of the pulse source is controlled by the amplitude of the output of an error amplifier whose inputs are a first signal representative of the condition of the reversible counter and a second signal representative of the amplitude of the analog message wave to be converted. Additionally, the positive or negative deviation of the output of the error amplifier from an equilibrium condition is respectively representative of which one of the first and second signals is greater than the other. This deviation is employed to control whether the positive or negative pulse outputs of the variable repetition rate bipolar source are passed to the input of the reversible binary counter which performs addition in response to positive pulses and subtraction in response to negative pulses.

In such an illustrative embodiment, faithful encoding of an analog signal having a 100 kilocycle bandwidth may be accomplished by employing a narrowband or relatively low quality error amplifier, i.e., one having a bandwidth of only about 500 kilocycles. For relatively low amplitude error signals the response of the low qaulity amplifier is sufficient to allow the illustrative converter to operate in the manner of a conventional Heising-type arrangement, i.e., in a manner in which the amplifier is fast enough to follow the step-by-step count of the reversible counter. For relatively high amplitude error signals, however, the counting rate of the reversible counter is increased and the low quality amplifier is then not capable of following the higher frequency step-by-step changes in the output level of the counter. Nevertheless, by acting as a stable position servo system during the existence of high amplitude error signals, the illustrative converter is still fully capable of faithfully encoding rapid changes in the input analog signal to be converted.

It is a feature of the present invention that an analog-to-digital converter include a variable repetition rate bipolar pulse source, and a reversible counter responsive thereto.

It is another feature of this invention that an analog-to-digital converter include a variable repetition rate bipolar pulse source, a reversible counter driven by the output of the pulse source, and a narrowband error amplifier responsive to the condition of the counter and the amplitude of the input analog signal to be converted for controlling both the repetition rate of the source and the polarity of pulses applied by the source to the reversible counter.

A complete understanding of the present invention and of the above and other features and advantages thereof may be gained from a consideration of the following detailed description of an illustrative embodiment thereof presented hereinbelow in connection with the accompanying drawing, in which:

FIG. 1 is a schematic showing of a specific illustrative analog-to-digital converter which embodies the principles of the present invention;

FIGS. 2A, 2B, and 2C are graphical depictions helpful to an understanding of the operation of the converter shown in FIG. 1;

FIG. 3A illustrates a voltage-controlled variable frequency oscillator of a form which may be included in the converter of FIG. 1;

FIG. 3B graphically shows the mode of operation of the oscillator of FIG. 3A;

Figure 1:
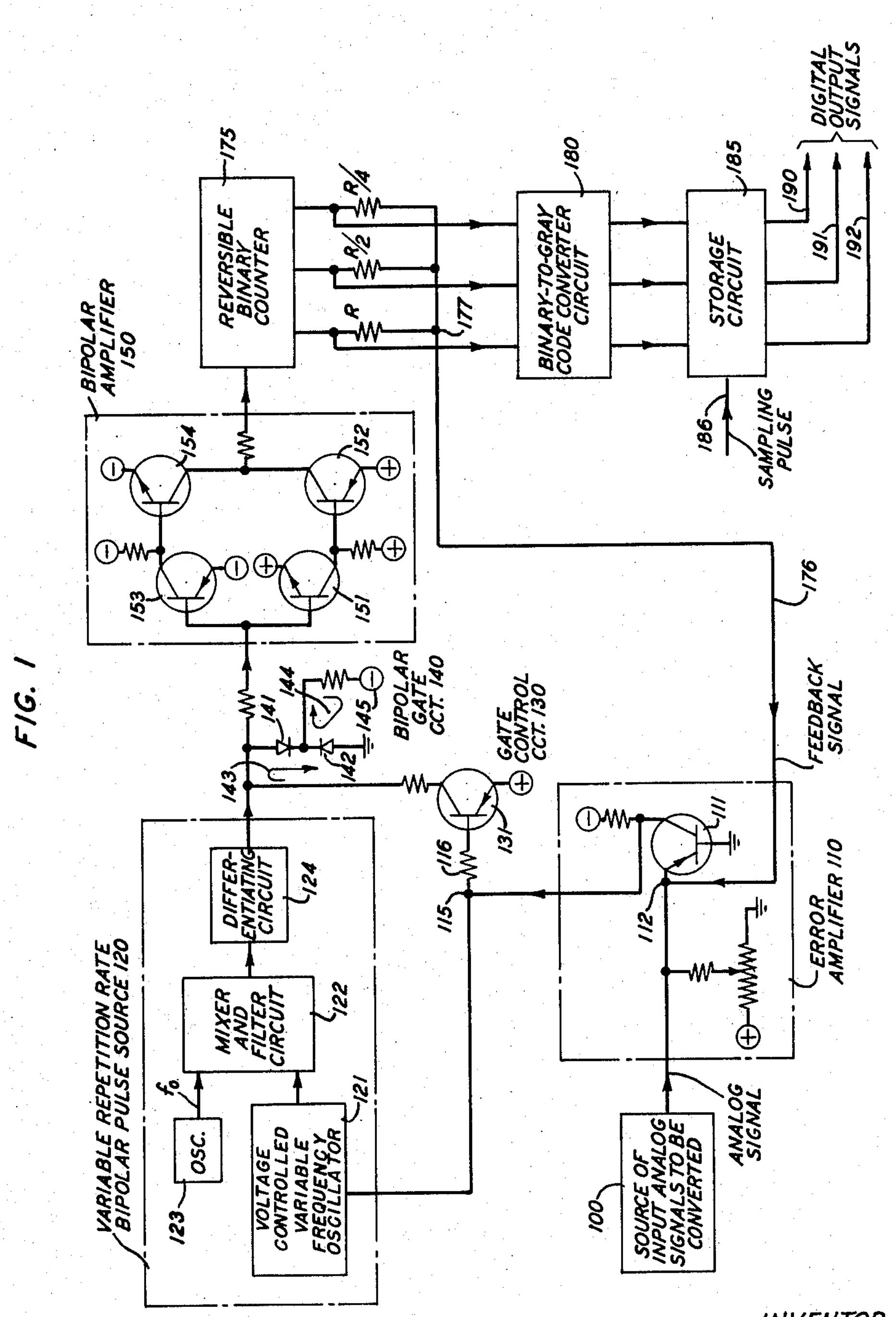

Referring now to FIG. 1, there is shown a specific illustrative analog-to-digital converter embodying the principles of the present invention. Looking at FIG. 1 from an over-all standpoint, the converter shown there receives from a source 100 input analog signals to be converted and provides on output leads 190, 191, and 192 digital signals which are representative of the signals applied to the converter from the source 100.

The converter of FIG. 1 includes a relatively narrowband error or comparison amplifier 110 which, for a specific case wherein the bandwidth of the input analog signals is about 100 kilocycles, need have a bandwidth of only about 500 kilocycles. The inputs to the amplifier 110 are signals from the analog source 100, which signals the amplifier 110 is capable of following or responding to without any time delay, and feedback signals representative of the count of a reversible binary counter 175, which feedback signals the amplifier 110 may or may not be capable of following in a step-by-step manner, depending upon whether the counting rate of the counter 175 is relatively low or high, respectively.

The collector electrode of transistor 111 of the amplifier 110 is connected to a node point 115 which is connected via an isolating resistor 116 to the base electrode of transistor 131 of a gate control circuit 130. The node point 115 is also connected to a variable repetition rate bipolar pulse source 120 which includes a voltage-controlled variable frequency oscillator 121 whose configuration and mode of operation are described in detail hereinbelow in connection with the description of FIGS. 3A, 3B, and 3C.

The output of the source 120 is applied to a bipolar gate circuit 140 which, depending upon whether the gate control circuit 130 is in a conducting or a nonconducting condition, is capable of passing only positive or negative pulses, respectively, via bipolar amplifier 150 to the reversible counter 175. The output of the counter 175 appears across binary-weighted resistors R, R/2, and R/4. Advantageously, to minimize inaccuracies in the abstraction of digital output signals from the counter 175, the output thereof is applied to a binary-to-Gray code converter circuit 180 of conventional form and is then applied to a conventional storage circuit 185 which in response to each sampling pulse appearing on lead 186 causes a digital representation of the input analog signal to appear on the output leads 190, 191, and 192. It is known that the sampling pulses applied to the circuit 185 should occur at a rate slightly higher than twice the highest frequency present in the input analog message wave.

It is noted that the bipolar gate circuit 140 is of the general form of the circuit disclosed in my copending application Serial No. 28,402, filed May 11, 1960, now Patent 3,111,593, issued November 19, 1963. The major difference therebetween is that the current through each of the series-opposed tunnel diodes of the circuit of the noted copending application is generally the same, whereby that circuit responds to either positive or negative input pulses to undergo a switching cycle. On the other hand, in the circuit 140 included in the herein-described illustrative converter, the current through one tunnel diode is always different from that through the other. This asymmetrical biasing arrangement primes only one of the diodes at a time to respond to input pulses. More specifically, the circuit 140 responds only to positive pulses when diode 141 carries the greater current and only to negative pulses when diode 142 carries the greater current.

Normally, i.e., when the input analog signal level and the count of the reversible counter 175 are both zero, or more generally whenever the input analog signal and the feedback signal from the counter tend to drive the emitter electrode of the transistor 111 of the error amplifier 110 positive and negative, respectively, by equal or almost equal amounts, the voltage of the node point 115 with respect to ground is a predetermined positive voltage $V_0$ which is a function of the bias supplies and resistors connected to the electrodes of the transistor 111.

The positive voltage $V_0$ appearing at the node point 115 causes transistor 131 of the gate control circuit 130 to be nonconductive. The voltage $V_0$ is also applied to the voltage-controlled variable frequency oscillator 121 in the bipolar pulse source 120 to cause the output frequency of the oscillator 121 to be $f_0$. The output of the oscillator 121 is combined in a conventional mixer and filter circuit 122 with the output frequency $f_0$ of a constant frequency oscillator 123. The filter portion of the circuit 122 is designed to permit only the difference between the frequencies emanating from the oscillators 121 and 123 to pass to a conventional differentiating circuit 124. Accordingly, when the node point 115 is at the predetermined equilibrium voltage $V_0$, the output frequency passed to the circuit 124 is $f_0-f_0$ or simply a direct-current level signal. Such a signal is not effective to cause counting pulses to be applied via the circuit 140 and the amplifier 150 to reversible counter 175. Accordingly, the count of the counter 175 is neither increased nor decreased, which is as it should be for such a signal resulted from a condition in which the output of the counter 175 was already exactly or almost exactly representative of the input analog signal applied to the illustrative converter by the source 100.

Assume now that the input analog signal level instantaneously becomes greater than the level represented by the signal applied by the counter 175 via feedback path 176 to the transistor 111 of the error amplifier 110. Such a condition causes conduction through the transistor 111 to increase and the voltage of the node point 115 to accordingly fall to a level, for example $V_1$, which is less positive than the equilibrium voltage $V_0$, the difference $V_0-V_1$ being the error signal output of the amplifier 110. In turn, $V_1$ causes the transistor 131 of the gate control circuit 130 to conduct, which passes a current through the tunnel diodes 141 and 142 in the direction indicated by arrow 143, thereby biasing the bipolar gate circuit 140 to allow only positive pulses from the variable repetition rate bipolar pulse source 120 to pass to the bipolar amplifier 150. Furthermore, the voltage $V_1$ causes the frequency of the output of the oscillator 121 to decrease to a value $f_1$, which causes bipolar pulses having a repetition frequency $f_0-f_1$ to appear at the output of the source 120. However, as indicated above, only positive output pulses are passed by the circuit 140 to the amplifier 150.

The amplifier 150 is a complementary push-pull arrangement of conventional form. Transistors 151 and 152 thereof respond to positive input pulses from the circuit 140 to supply amplified replicas of the pulses to the counter 175. In turn, the counter 175, which may advantageously be of the form of the high speed reversible counter disclosed in my copending application Serial No. 39,117, filed June 27, 1960, responds to the application thereto of positive pulses by increasing its count, thereby increasing the magnitude of the feedback signal applied via path 176 to the emitter electrode of the transistor 111 of the error amplifier 110. As a result, the voltage of the node point 115 returns in time to the equilibrium value $V_0$ which, as described above, is not effective to cause a change in the condition of the counter 175.

Assume now that the input analog signal level instantaneously becomes less than the level represented by the signal applied via feedback path 176 to the error amplifier 110. Such a condition causes conduction through the transistor 111 of the amplifier 110 to increase, whereby the voltage of the node point 115 falls to a level, for example $V_2$, which is more positive than the equilibrium voltage $V_0$, the difference $V_2-V_0$ being the error signal output of the amplifier 110. In turn, $V_2$ causes the transistor 131 of the gate control circuit 130 to be nonconductive. In other words, no current flows through the tunnel diodes 141 and 142 of the circuit 140 in the direction of the arrow 143. Current does, however, flow from bias source 145 through the bottom tunnel diode 142 in the direction of arrow 144, thereby biasing the bipolar gate circuit 140 to allow only negative pulses from the variable repetition rate bipolar source 120 to pass to the bipolar amplifier 150.

Furthermore, the voltage $V_2$ appearing at the node point 115 causes the frequency of the oscillator 121 to increase to a value $f_2$, which causes bipolar pulses having a repetition frequency $f_2-f_0$ to appear at the output of the source 120. However, as indicated above, only the negative output pulses are passed by the circuit 140 to the amplifier 150, the upper transistors 153 and 154 of which respond to negative input pulses to supply amplifier replicas thereof to the counter 175. In turn, the counter 175 responds to the application thereto of negative pulses by decreasing its count, thereby decreasing the magnitude of the feedback signal applied via path 176 to the emitter electrode of the transistor 111 of the error amplifier 110. Finally, the voltage of the node point 115 returns to the equilibrium value $V_0$ which, as specified above, is not effective to cause a change in the condition of the counter 175.

Figure 2A:
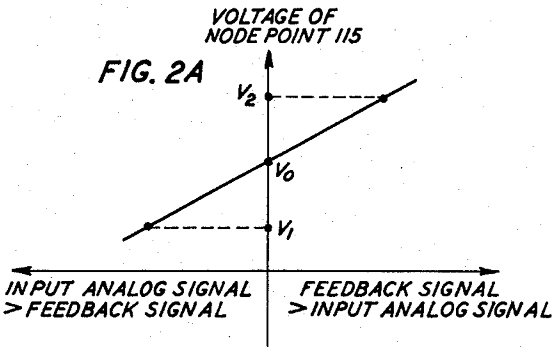

FIG. 2A graphically depicts the variation of the voltage of the node point 115 as a function of the relative magnitudes of the feedback signal and the input analog signal.

As indicated hereinabove, for relatively low amplitude error signals (in other words, for relatively gradual changes in the amplitude of the input analog signal to be converted) the response of the low quality error amplifier 110 of the illustrative converter shown in FIG. 1 is sufficient to allow the converter to follow the counting rate of the reversible counter 175 in a step-by-step manner, in the manner of a Heising-type arrangement. For relatively high amplitude error signals, however, the counting rate of the reversible counter 175 is significantly increased and the narrowband error amplifier 110 is then not capable of following the higher frequency step-by-step changes in the output level of the counter 175. Nevertheless, by acting as a stable position servo system during the existence of high amplitude error signals, the herein-described converter is still fully capable of faithfully encoding rapid changes in the input analog signal.

Figure 2B:
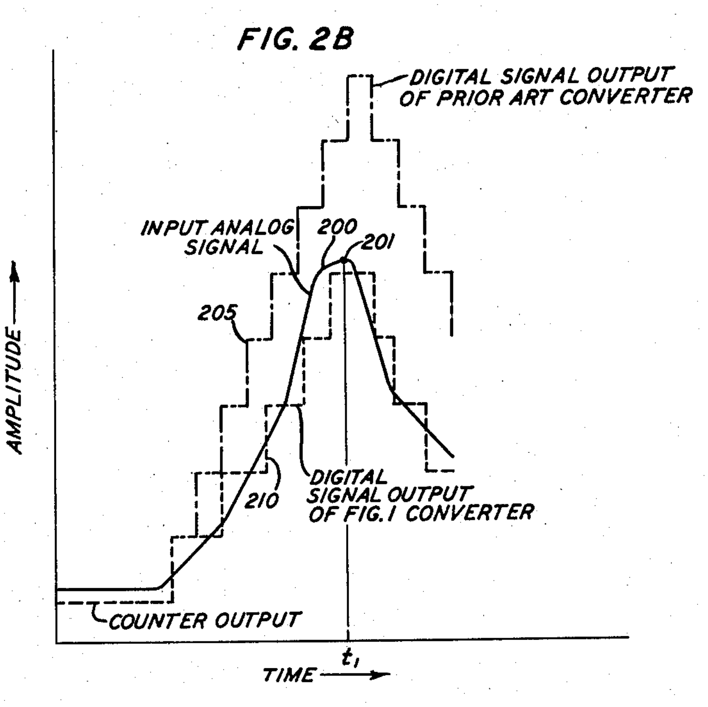
Figure 2C:
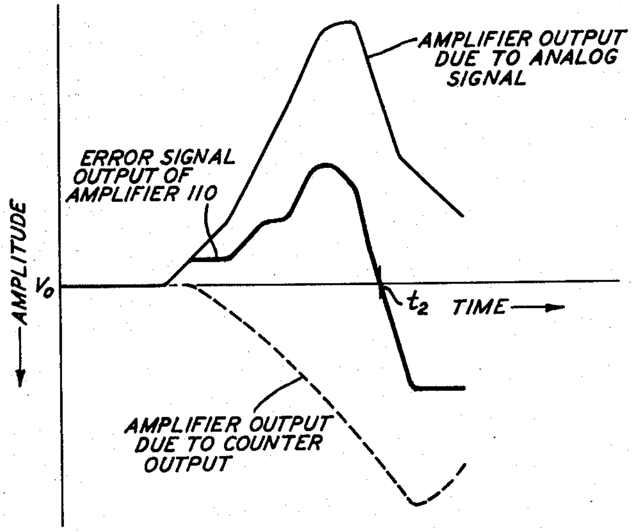

The ability of the converter shown in FIG. 1 to faithfully encode rapid changes in the input analog signal, even through the converter includes a relatively narrowband amplifier, is effectively depicted in graphical terms in FIGS. 2B and 2C. In FIG. 2B, the waveform 200 of the input analog signal is shown together with the waveform 205 of the digital signal output of a Heising-type converter modified for illustrative purposes to include a low quality error amplifier of the type included in the converter shown in FIG. 1. Because of the narrowband or slow response characteristics of such an error amplifier, the counter of the modified Heising-type converter would, for example, continue to count in an upward direction even after the amplitude of the input analog signal to be converted reached its maximum point 201 and had started to decrease. Specifically, and looking at FIG. 2C, it is seen that the error signal output of the amplifier 110 does not return to the equilibrium voltage value $V_0$ until some time $t_2$ subsequent to the time $t_1$ (FIG. 2B) corresponding to the occurrence of the maximum point 201. Accordingly, the counter of a modified prior art converter would continue to increase its count during the time interval $t_2-t_1$, which, as indicated by the waveform 205 in FIG. 2B, causes the output of the counter to overshoot in effect the waveform 200 of the analog signal wave to be converted. As a result, the output of the counter of such a modified prior art converter is not a faithful representation in digital terms of the input analog signal.

On the other hand, if, in accordance with the principles of the present invention, the repetition rate of the counting pulse source is selectively varied in accordance with the magnitude of the error signal output of the amplifier 110, the output of the reversible counter is found to be a faithful representation of the input analog signal, as is evident by comparing waveforms 200 and 210 of FIG. 2B, even through for some variations of the input analog signal the amplifier 110 is not capable of following the counter output in a step-by-step fashion. For such variations, the converter of FIG. 1 acts as a stable position servo system of the general type of the one shown in FIG. 5.

Figure 5:
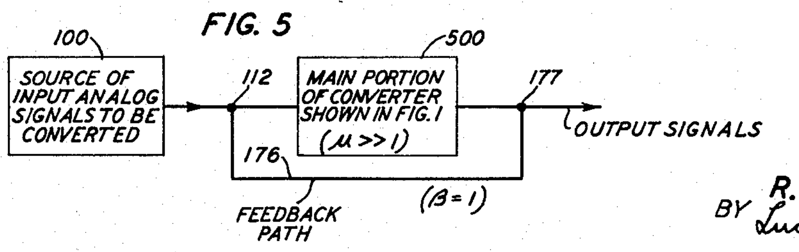
FIG. 5 depicts a feedback system which is representative of the converter shown in FIG. 1.

In FIG. 5, block 500 represents the amplifiers 110 and 150, the source 120, the counter 175, and the circuits 130 and 140 of the converter shown in FIG. 1. The source 100, the nodes 112 and 177, and the feedback path 176, shown in FIG. 5, are identified by corresponding reference numerals in FIG. 1. Additionally, in FIG. 5, $\mu$ represents the amplification factor of the block 500 and $\beta$ represents the feedback ratio of the system. It is known that the FIG. 5 type feedback system is capable, despite the presence of nonlinearities and noise in the block 500, of providing output signals which are faithful replicas of the input signal applied thereto.

Figure 3A:
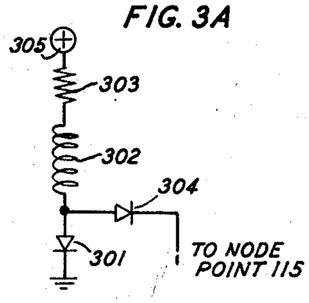
FIG. 3C depicts in graphical terms the difference between the output frequency of the oscillator of FIG. 3A and the frequency of a fixed frequency oscillator as a function of the control or error signal applied to the variable frequency oscillator.

Turning now to FIG. 3A, there is shown an oscillator arrangement of a type which may advantageously be employed as the voltage-controlled variable frequency oscillator 121 of the bipolar pulse source 120. The oscillator of FIG. 3A includes a tunnel diode 301 connected in series with an inductor 302, a resistor 303, and a positive bias source 305. Additionally, the plate electrode of a conventional asymmetrically-conducting device 304 is connected to the plate electrode of the diode 301, the cathode electrode of the device 304 being connected to the node point 115 of FIG. 1. Thus, the voltage of the node point 115 with respect to ground serves as a bias source for the device 304.

Figure 3B:
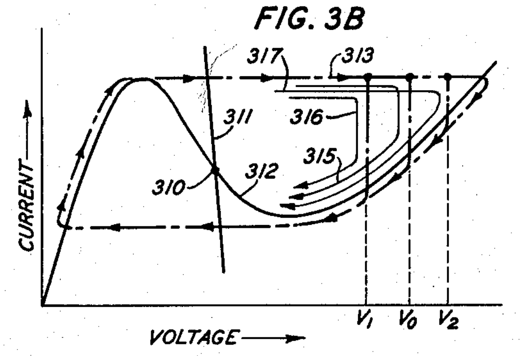

If the device 304 is removed from the arrangement shown in FIG. 3A, and if the operating point of the tunnel diode 301 is selected to occur at point 310 of FIG. 3B, which point is defined by the intersection of load line 311 with the voltage-current characteristic curve 312 of the tunnel diode 301, the oscillatory behavior of the arrangement can be represented by the dot-dash path 313, one complete traversal of which corresponds to a cycle of operation of the oscillator of FIG. 3A.

If the device 304 is then returned to the oscillator arrangement shown in FIG. 3A and a positive bias of $V_0$ applied to the cathode electrode of the device, the oscillatory path of operation of the circuit of FIG. 3A is modified over the right-hand portion of FIG. 3B so as to follow the path indicated by solid arrow 315. Similarly, when the positive bias applied to the device 304 assumes the value $V_1$, the oscillatory path of operation is modified so as to follow the path indicated in part by solid arrow 316, and when the value of the positive bias is $V_2$, the modified path of operation is indicated in part in FIG. 3B by solid arrow 37.

Figure 3C:
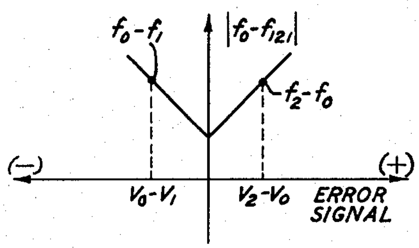

Analysis of the mode of operation of the oscillator arrangement depicted in FIG. 3A reveals that the frequency of oscillation thereof is higher when a bias greater than $V_0$ is applied to the device 304 than when a bias $V_1$ which is less than $V_0$ is applied thereto. Thus, when the voltage of the node point 115 of FIG. 1 increases above the value $V_0$, to, say, $V_2$, the frequency of operation of the oscillator 11 increases to $f_2$ and the difference between the outputs of the oscillators 121 and 123 also increases, the magnitude of the difference frequency being directly proportional to the increase of the voltage of the node point 115 over the equilibrium voltage value $V_0$. Similarly, when the voltage of the node point 115 decreases below the value $V_0$, to, say, $V_1$, the frequency of operation of the oscillator 121 decreases to $f_1$ and the difference between the outputs of the oscillators 121 and 123 again increases to a value which is directly proportional to the increase of the node point voltage. The effect of voltage variations of the node point 115 on the output frequency of the mixer and filter circuit 122 is summarized in graphical form in FIG. 3C. In FIG. 3C, and also in FIG. 4, the symbol $f_{121}$ represents the output frequency of the oscillator 121.

Figure 4:
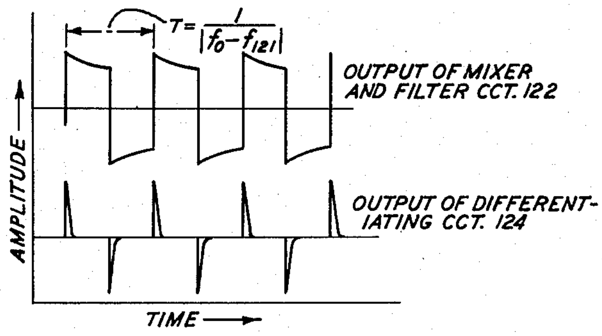
FIG. 4 depicts several waveforms characteristic of the variable repetition rate bipolar pulse source included in the FIG. 1 converter.

The output of the mixer and filter circuit 122 is shown in FIG. 4 for a specific case in which the output frequencies of the oscillators 121 and 123 are different. Also shown in FIG. 4, for the specific case, are the bipolar pulses which are supplied by the differentiating circuit 124 to the bipolar gate circuit 140.

In summary, the herein-described specific illustrative analog-to-digital embodiment of the principles of the present invention has been shown to be capable of faithfully converting analog signals into digital representations thereof despite the inclusion in the embodiment of a simple narrowband error amplifier whose response is inadequate to follow relatively high frequency step-by-step changes in the output condition of the embodiment.

It is to be understood that the above-described arrangements are only illustrative of the application of the present invention. Numerous other arrangements may be devised by those skilled in the art without departing from the spirit and scope of the invention. For example, although only a three-digit converter is depicted in FIG. 1, it is to be clearly understood that in acocrdance with the principles set forth herein an *n*-digit analog-to-digital converter may be constructed.

What is claimed is:

1. In combination in a system for converting analog signals into digital representations thereof, a source of continuous analog signals characterized by intelligence-bearing amplitude variations, reversible counting means, error amplifier means responsive to analog signals to be converted and to output signals of the continuous analog type from said analog signal source and said counting means, respectively, for supplying bipolar analog type error signals indicative of the relationship between said analog signals and said output signals, and pulse means responsive to said error signals for supplying to said counting means pulses whose repetition rate and polarity are a function of said error signals.

2. In combination in a system for converting analog signals into digital representations thereof, a source of continuous analog signals characterized by intelligence-bearing amplitude variations, reversible binary counting means, error amplifier means responsive to an analog signal to be converted and to a binary-weighted analog type output signal representative of the count of said counting means for supplying an analog type error signal indicative of the relative amplitudes of said analog and output signals, said analog signal being supplied by said analog signal source, a variable repetition rate source responsive to the amplitude of said error signal for supplying bipolar pulses whose repetition rate is directly proportional to the amplitude of said error signal, and gate circuit means responsive to the polarity of said error signal for passing pulses of only one polarity from said source to said counting means.

3. A combination as in claim 2 wherein said variable repetition rate source includes a voltage-controlled variable frequency oscillator connected to said error amplifier means, a fixed frequency oscillator, and mixer and filter means responsive to output signals from said two oscillators for providing only a difference frequency signal.

4. A combination as in claim 3 further including differentiating means responsive to said difference frequency signal for supplying bipolar pulses.

5. A combination as in claim 2 wherein said gate circuit means includes a gate control circuit which conducts in response to one polarity of said error signal and does not conduct in response to the other polarity thereof.

6. A combination as in claim 5 further including a bipolar gate circuit respectively responsive to the conduction condition of said gate control circuit for passing pulses of only one polarity from said source to said counting means.

7. In combination in a system for converting analog signals into digital representations thereof, a source of continuous analog signals characterized by intelligence-bearing amplitude variations, reversible binary counting means having an output node, error amplifier means having an input node to which an input analog signal to be converted is applied, said input signal being supplied by said analog signal source, a feedback path connecting said output node to said input node for coupling a binary-weighted analog type signal representative of the condition of said counting means to said error amplifier means, said error amplifier means having an output node characterized by an equilibrium voltage of a value $V_0$ when said binary-weighted signal and said input analog signal are substantially equal in magnitude, the output node voltage deviating from $V_0$ in one direction when said binary-weighted signal is significantly greater than said input analog signal and in the other direction therefrom when said input analog signal is significantly greater than said binary-weighted signal, and means connected to the output node of said error amplifier means for supplying to said reversible binary counting means pulses whose repetition rate and polarity are directly proportional to the amplitude and direction of the deviation of the output node voltage from said equilibrium voltage value.

References Cited in the file of this patent

UNITED STATES PATENTS

| | | |
|---|---|---|
| Re. 23,686 | Heising | July 14, 1953 |
| 2,951,202 | Gordon | Aug. 30, 1960 |
| 2,957,943 | Rack | Oct. 25, 1960 |
| 3,007,149 | Brown | Oct. 31, 1961 |
| 3,014,210 | Beaumont | Dec. 19, 1961 |